United States Patent
Hwang et al.

(10) Patent No.: US 7,589,387 B2
(45) Date of Patent: Sep. 15, 2009

(54) SONOS TYPE TWO-BIT FINFET FLASH MEMORY CELL

(75) Inventors: Jiunn-Ren Hwang, Hsin-Chu (TW); Min-Hwa Chi, Taipei (TW); Fu-Liang Yang, Hsin-Chu (TW)

(73) Assignee: Taiwan Semiconductor Manufacturing Company, Ltd., Hsin-chu (TW)

( * ) Notice: Subject to any disclaimer, the term of this patent is extended or adjusted under 35 U.S.C. 154(b) by 390 days.

(21) Appl. No.: 11/243,771

(22) Filed: Oct. 5, 2005

(65) Prior Publication Data
US 2007/0076477 A1    Apr. 5, 2007

(51) Int. Cl.
*H01L 27/088* (2006.01)
(52) U.S. Cl. .............................. 257/401; 257/E29.274; 257/347; 257/321
(58) Field of Classification Search ................. 257/401, 257/E29.274, 321; 438/216, 287
See application file for complete search history.

(56) References Cited

U.S. PATENT DOCUMENTS

2006/0071259 A1*  4/2006  Verhoeven ................. 257/299
2007/0018245 A1*  1/2007  Jeng ........................... 257/344
2008/0116508 A1*  5/2008  Hayashi et al. ............. 257/324
2008/0254585 A1* 10/2008  Takaya ...................... 438/287

OTHER PUBLICATIONS

Kim, K., et al., "Future Memory Technology including Emerging New Memories," Proc. 24th International Conference on Microelectronics (MIEL 2004), vol. 1, NIS, Serbia and Montenegro, May 16-19, 2004, pp. 377-384.
Atwood, G., "Future Directions and Challenges for ETox Flash Memory Scaling," IEEE Transactions on Device and Materials Reliability, vol. 4, No. 3, Sep. 2004, pp. 301-305.
She, M., et al., "Silicon-Nitride as a Tunnel Dielectric for Improved SONOS-Type Flash Memory," IEEE Electron Device Letters, vol. 24, No. 5, May 2003, pp. 309-311.
Chen, T.-S., et al., "Performance Improvement of SONOS Memory by Bandgap Engineering of Charge-Trapping Layer," IEEE Electron Device Letters, vol. 25, No. 4, Apr. 2004, pp. 205-207.

(Continued)

*Primary Examiner*—Jerome Jackson, Jr.
*Assistant Examiner*—Paul A Budd
(74) *Attorney, Agent, or Firm*—Slater & Matsil, L.L.P.

(57) ABSTRACT

A 2-bit FinFET flash memory cell capable of storing 2 bits and a method of forming the same are provided. The memory cell includes a semiconductor fin on a top surface of a substrate, a gate insulation film on the top surface and sidewalls of a channel section of the semiconductor fin, a gate electrode on the gate insulation film, and two charge-trapping regions along opposite sides of the gate electrode, wherein each charge-trapping region is separated from the gate electrode and the semiconductor fin by a tunneling layer. The memory cell further includes a protective layer on the charge-trapping regions. Each of the two charge-trapping regions is capable of storing one bit. The memory cell can be operated by applying different bias voltages to the source, the drain, and the gate of the memory cell.

14 Claims, 15 Drawing Sheets

OTHER PUBLICATIONS

Lusky, E., et al., "Investigation of Channel Hot Electron Injection by Localized Charge-Trapping Nonvolatile Memory Devices," IEEE Transactions on Electron Devices, vol. 51, No. 3, Mar. 2004, pp. 444-451.

Larcher, L., et al., "Impact of Programming Charge Distribution of Threshold Voltage and Subthreshold Slope of NROM Memory Cells," IEEE Transactions on Electron Devices, vol. 49, No. 11, Nov. 2002, pp. 1939-1946.

Eitan, B., et al., "NROM: A Novel Localized Trapping, 2-Bit Nonvolatile Memory Cell," IEEE Electron Device Letters, vol. 21, No. 11, Nov. 2000, pp. 543-545.

Larcher, L., et al., "On the Physical Mechanism of the NROM Memory Erase," IEEE Transactions on Electron Devices, vol. 51, No. 10, Oct. 2004, pp. 1593-1599.

Yeh, C.C., et al., "Novel Operation Schemes to Improve Device Reliability in a Localized Trapping Storage SONOS-Type Flash Memory," IEDM, 2003, pp. 173-176.

Specht, M., et al., "Retention Time of Novel Charge Trapping Memories Using $Al_2O_3$ Dielectrics," IEEE, 2003, pp. 155-158.

Wang, X., et al., "A Novel MONOS-Type Nonvolatile Memory Using High-κ Dielectrics for Improved Data Retention and Programming Speed," IEEE Transactions on Electron Devices, vol. 51, No. 4, Apr. 2004, pp. 597-602.

Tan, Y.-N., et al., "Over-Erase Phenomenon in SONOS-Type Flash Memory and Its Minimization Using a Hafnium Oxide Charge Storage Layer," IEEE Transactions on Electron Devices, vol. 51, No. 7, Jul. 2004, pp. 1143-1147.

Sugizaki, T., et al., "Novel Multi-Bit SONOS Type Flash Memory Using a High-κ Charge Trapping Layer," 2003 Symposium on VLSI Technology Digest of Technical Papers, 3B-1, pp. 27-28.

Lee, Y.K., et al., "Multi-Level Vertical Channel SONOS Nonvolatile Memory on SOI," 2002 Symposium on VLSI Technology Digest of Technical Papers, pp. 208-209.

Lee, Y.K., et al., "Multilevel Vertical-Channel SONOS Nonvolatile Memory on SOI," IEEE Electron Device Letters, vol. 23, No. 11, Nov. 2002, pp. 664-666.

Sung, S.-K., et al., "Fabrication and Program/Erase Characteristics of 30-nm SONOS Nonvolatile Memory Devices," IEEE Transactions on Nanotechnology, vol. 2, No. 4, Dec. 2003, pp. 258-264.

Xuan, P., et al., "FinFET SONOS Flash Memory for Embedded Applications," IEEE International Electron Devices Meeting, 2003, pp. 26.4.1-4.

Specht, M., et al., "Sub-40nm Tri-Gate Charge Trapping Nonvolatile Memory Cells for High-Density Applications," 2004 Symposium on VLSI Technology Digest of Technical Papers, IEEE, pp. 244-245.

Cho, I.H., et al., "Body-Tied Double-Gate SONOS Flash (Omega Flash) Memory Device Built on Bulk Si Wafer," Device Research Conference, 2003, pp. 133-134.

Cho, E.S., et al., "Optimized Cell Structure for FinFET Array Flash Memory," IEEE, 2004, pp. 289-292.

Fukuda, M., et al., "New Nonvolatile Memory with Charge-Trapping Sidewall," IEEE Electron Device Letters, vol. 24, No. 8, Jul. 2003, pp. 490-492.

Fukuda, M., et al., "Scaled 2 Bit/Cell SONOS Type Nonvolatile Memory Technology for sub-90nm Embedded Application Using SiN Sidewall Trapping Structure," IEDM, 2003, pp. 909-912.

Yoshida, E., et al., "A Design of a Capacitorless 1T-DRAM Cell Using Gate-Induced Drain Leakage (GIDL) Current for Low-Power and High-Speed Embedded Memory," IEDM, 2003, pp. 913-916.

Mouis, M., et al., "Velocity Distribution of Electrons along the Channel of Nanoscale MOS Transistors," IEEE, 2003, pp. 147-150.

\* cited by examiner

SONOS TYPE TWO-BIT FINFET FLASH MEMORY CELL

TECHNICAL FIELD

This invention relates generally to flash memory cells, and more particularly to the manufacture of FinFET flash memory cells capable of storing 2 bits (2-bit FinFET flash memory cells).

BACKGROUND

Among known flash memory cells, the dual-poly floating-gate EPROM tunnel oxide (ETOX) memory cell is one of the most popular. Its floating poly gate serves as a charge storage element. However, a conventional ETOX type memory cell faces significant engineering challenges. Compared to ETOX memory cells, silicon-oxide-nitride-oxide-silicon (SONOS) flash memory cells have a thinner gate-stack, and therefore are better candidates for scaling and process integration.

Currently, SONOS flash memory cells are based on the planar MOSFET transistor with a silicon-oxide-nitride-oxide-silicon gate structure. FIG. 1A illustrates a planar SONOS flash memory cell. A nitride layer (floating gate) 4 is used for trapping and storing charges representing digital data "1" or "0." Charges can also be trapped locally in the oxide-nitride-oxide (ONO) structure, which comprises an oxide 2, nitride 4, and oxide 6, near source 8 or drain 10 for 2-bits-per-cell storage. The charge-trapping layer (nitride) 4 in SONOS flash memory cells can also be advantageously replaced by another high-k dielectric for better charge retention, less over-erasing, etc.

However, the development of the SONOS flash memory cell faces challenges. Planar SONOS flash memory cells have a relatively thicker ONO structure (including bottom tunnel oxide, charge trapping SiN, and top oxide) than thin-gate CMOS transistors, and thus are more difficult to scale than thin-gate MOS transistors. This posts severe limitations on SONOS flash memory cells due to short channel effects.

Nitride sidewall (or spacer) trapping has been proposed for 2-bit storage in ETOX or SONOS flash memory. Additionally, gate-induced-drain-leakage (GIDL) was recently proposed for read operations due to its modulation by trapped charges in the floating gate (for ETOX memory cells) or in the nitride layer. However, in conventional sidewall trapping memories, due to the conventional channel-hot-electron (CHE) programming, charge injection toward sidewall spacers is sensitive to the position of the source/drain junction boundary. As a result, portions of the channel need to be directly underneath the spacers in order to achieve acceptable hot carrier injection. This will increase the channel length and the capacitance between the gate and the source/drain regions, making the memory cells hard to scale.

Most recently, SONOS type flash memory cells based on non-planar FinFETs have been proposed for taking advantage of FinFET's superior scalability. As is known, non-planar CMOS transistors (such as FinFETs or also known as tri-gate MOSFETs) are capable of much better gate control, leading to suppressed short channel effects at 45 nm and below. FIG. 1B illustrates a conventional SONOS type FinFET flash memory cell. It is evolved from the planar version of a SONOS flash memory cell, however, with better gate control and better scalability. The memory cell includes a fin 12, a gate 20, and a charge storage region 16 between two oxides 14 and 18.

The SONOS FinFET memory cell shown in FIG. 1B has better scaling capability. Unfortunately, it loses the capability for storing 2 bits per cell since the smaller gate length results in an inability to distinguish between local charges stored near the source and drain sides, respectively. For example, stored charges typically span around 40 nm. With charges stored on both ends, a gate length smaller than 100 nm will be marginal in its ability to maintain 2-bit storage capability. Additionally, the injection efficiency of charge will decrease significantly for very short channels. This is due to the carriers transporting along the channel in a more ballistic manner. The impact ionization mostly occurs after carriers entering the source/drain extension region reach heavily doped source/drain regions. Generated charges are therefore far away from the charge storage region.

Thus, there is the need for a method of fabricating a new memory cell structure, which is not only scalable in channel length, but also capable of storing 2-bits per cell with a more efficient hot carrier injection mechanism.

SUMMARY OF THE INVENTION

The preferred embodiments of the present invention provide a 2-bit FinFET flash memory cell capable of storing 2 bits and a method of forming the same.

In accordance with one aspect of the present invention, the memory cell includes a semiconductor fin on a top surface of a substrate. The semiconductor fin has two sidewalls and a top surface, wherein the two sidewalls extend substantially transversely to the top surface of the substrate, and wherein the top surface extends substantially parallel to the surface of the substrate. The semiconductor fin includes a channel section, two source/drain regions, and two extension sections. Each of the extension sections is between the channel section and the respective source/drain region. The memory cell further includes a gate insulation film on the top surface and sidewalls of the channel section of the semiconductor fin, a gate electrode on the gate insulation film, two tunneling layers along sidewalls of the gate electrode and at least portions of the fin close to the gate electrode, and two charge-trapping regions substantially along opposite sides of the gate electrode, wherein each of the charge-trapping regions is separated from the gate electrode and the fin by the respective tunneling layer.

In accordance with another aspect of the present invention, a memory cell array includes an array of 2-bit FinFET flash memory cells arranged in a plurality of rows and a plurality of columns, a plurality of word-lines connected to the rows of memory cells of the array with a word-line connected to the memory cells in the same row, a plurality of source bit-lines connected to the columns of memory cells of the array with a source bit-line connected to the sources of the memory cells in the same column, and a plurality of drain bit-lines connected to the columns of memory cells of the array with a drain bit-line connected to the drains of the memory cells in the same column.

In accordance with yet another aspect of the present invention, a method of using a 2-bit FinFET flash memory cell includes programming, reading and erasing the memory cell.

In order to program a bit of a memory cell, a voltage is applied between the source and drain regions, resulting in electron transport from one of the source/drain regions to another in a ballistic manner. Impact and ionization generates electron-hole pairs. Electrons then cross the tunneling layer into the charge-trapping region.

In order to read a bit of a memory cell, a voltage is applied between the source and drain regions. A voltage greater than the threshold voltage is applied to the gate. Channel current is measured to determine a state of the memory cell. Gate-induced drain leakage current can also be used to determine the state of the memory.

In order to erase a bit of a memory cell, a voltage is applied between the gate and source/drain, and charges trapped in the charge-trapping layer cross the tunneling layer into the respective source/drain layer under an electrical field by gate and source/drain region.

The preferred embodiments of the present invention are based on a new mechanism that utilizes ballistic transport of carriers through very short channels. The new mechanism efficiently charges the charge-trapping regions. The preferred embodiments of the present invention have charge-trapping regions outside a region above the channel region, therefore are well adapted for scaling, particularly for 45 nm and beyond.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 2A:
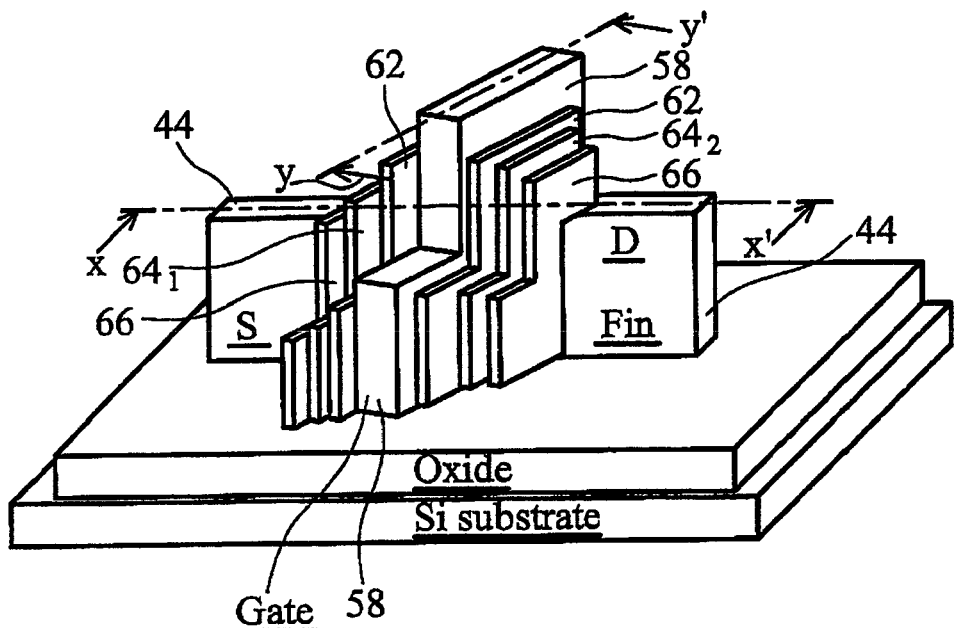
FIG. 2A illustrates a 3-D view of a preferred embodiment of the present invention.
Figure 2B:
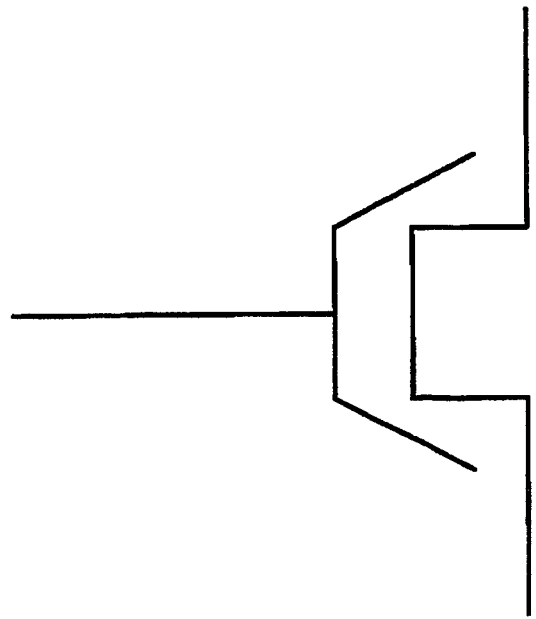
FIG. 2B illustrates a schematic symbol of the preferred embodiment of the present invention.
Figure 3:
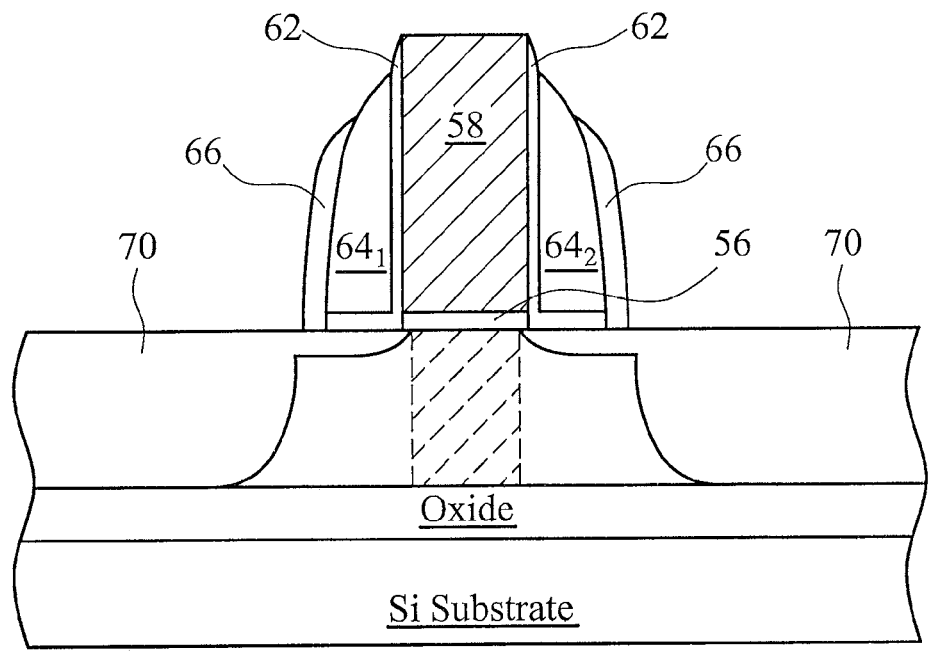
FIGS. 3 and 4 illustrate cross-sectional views of the preferred embodiment of the present invention shown in FIG. 2.
Figure 4:
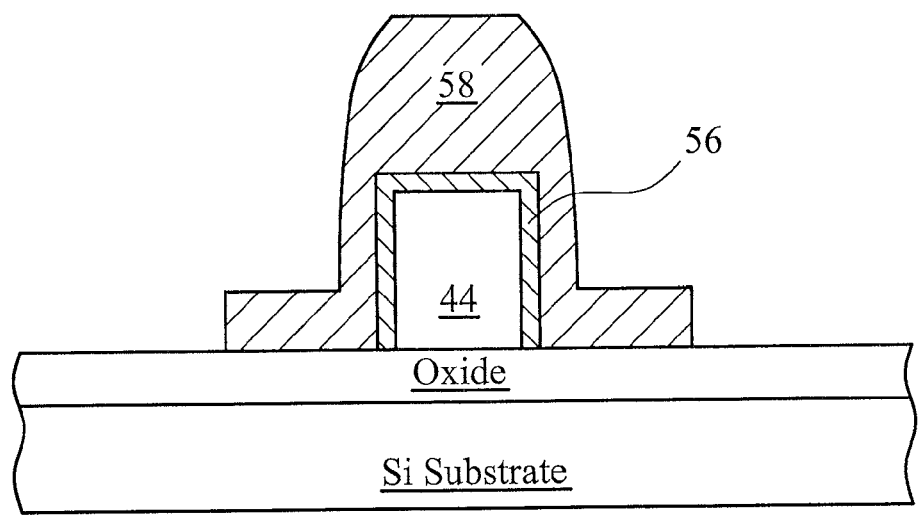

A 3-D view of a preferred embodiment of the present invention is schematically illustrated in FIG. 2A. The preferred embodiment is formed on an oxide, and includes thin-gate dielectrics 62, and a pair of charge-trapping regions $64_1$ and $64_2$ serving as 2-bit storage regions. Fin 44 includes source/drain regions and a channel region, which is controlled by a gate 58 that preferably wraps around fin 44. Dielectric layers 62 are used as tunneling layers. Top protection layers 66 prevent leakage of trapped electrons. FIG. 2B illustrates a schematic symbol of the preferred embodiments. Cross-sectional views of the preferred embodiment shown in FIG. 2A are illustrated in FIGS. 3 and 4. FIG. 3 illustrates a cross-sectional view along channel length (X-X') direction, and FIG. 4 illustrates a cross-sectional view along channel width (Y-Y') direction. The dotted line illustrates a portion of the gate electrode 58 that is not in the same plane.

Figure 5A:
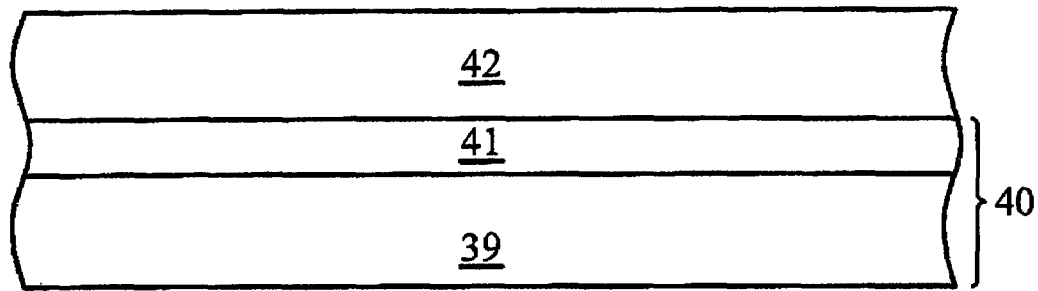
FIGS. 5A through 12 are cross-sectional views of intermediate stages in the manufacture of the preferred embodiments.

FIGS. 5A through 12 illustrate intermediate stages in the manufacture of the preferred embodiments of the present invention. FIG. 5A illustrates a silicon-on-insulator structure. Semiconductor layer 42 is preferably lightly doped with p-type impurities, and is preferably formed of silicon or other commonly used semiconductor materials, such as silicon-germanium, strained silicon, strained silicon-germanium, silicon on silicon-germanium, and the like. The semiconductor layer 42 preferably has a thickness of between about 10 nm and about 80 nm. A base structure 40 comprises a substrate 39 and an insulator 41 formed on the substrate 39. The insulator 41 is preferably an oxide layer, and the substrate 39 is preferably a silicon substrate or other common semiconductor substrate. A selective etching removes portions of the semiconductor layer 42, leaving a fin 44. FIG. 6A depicts a cross sectional view of the resulting structure along X-X' direction, and FIG. 6C illustrates a cross sectional view along Y-Y' direction. The width W of the fin 44 is preferably between about 5 nm and about 60 nm. Fin 44 includes two sidewalls 50 and a top surface 52. For simplicity, the elements below the fin 44 are marked as 40.

Figure 5B:
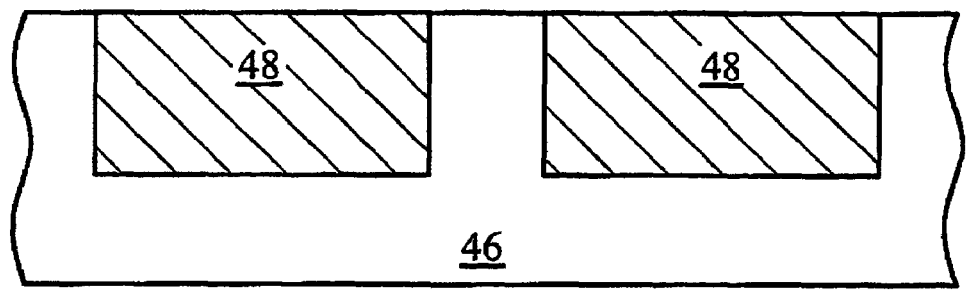
Figure 6A:
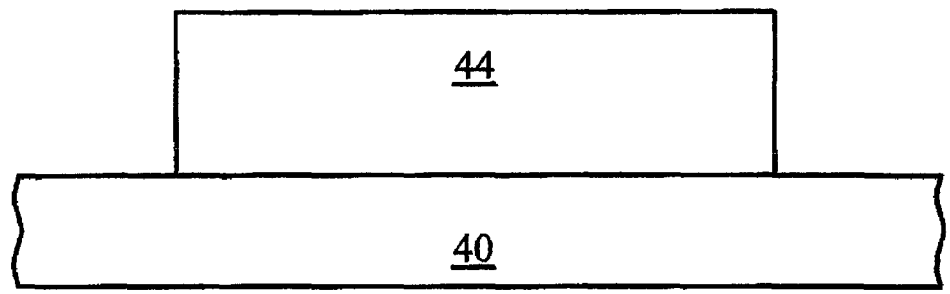
Figure 6B:
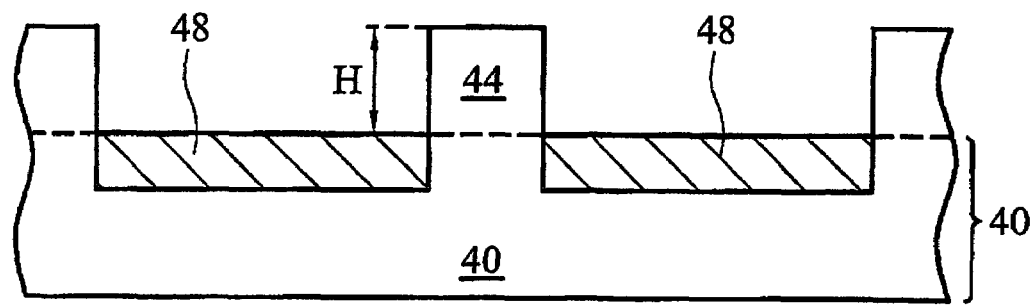
Figure 6C:
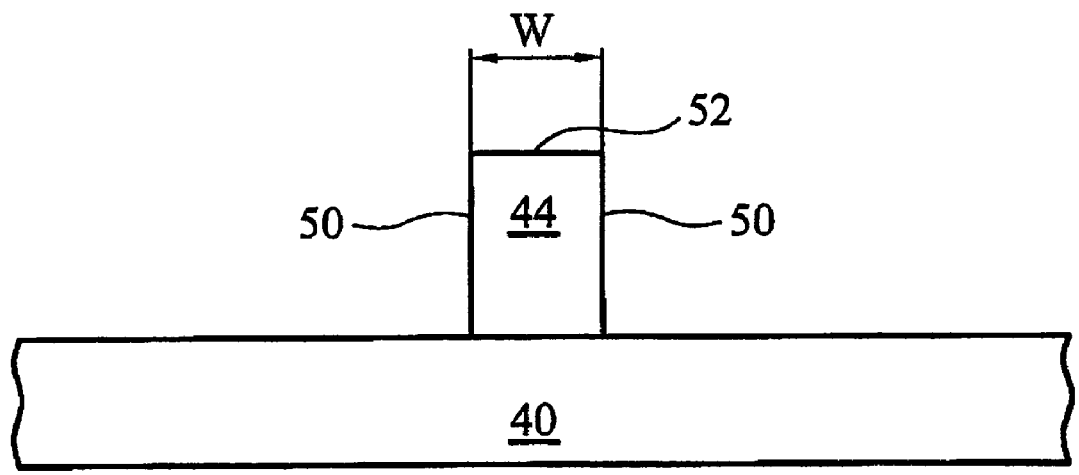

In other embodiments, the memory cell is formed on a bulk semiconductor material. FIG. 5B illustrates STIs 48 formed in bulk semiconductor 46. Semiconductor 46 may be bulk silicon, bulk silicon-germanium, an epitaxy layer on bulk silicon, an epitaxy layer on bulk silicon-germanium, and the like. STIs 48 are then recessed, as shown in FIG. 6B, and a portion of the semiconductor material extending higher than the top surface of STIs 48 forms fin 44. Preferably, the recessing distance H, hence the height of fin 44, is between about 200 Å and about 400 Å. For simplicity, the elements below the fin 44 are marked as 40.

Figure 7A:
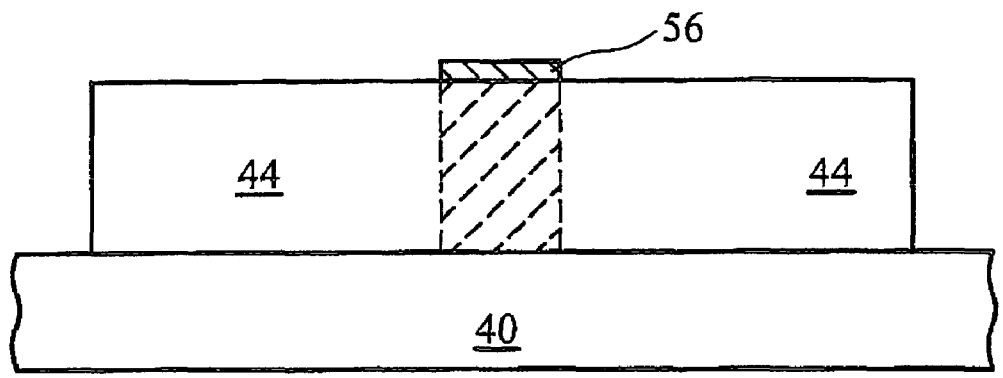
Figure 7B:
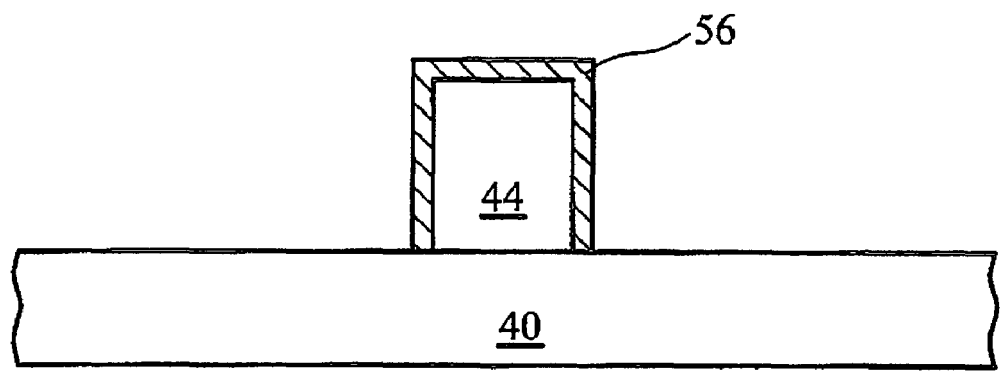

A thin gate dielectric 56 is formed on fin 44, as illustrated in FIGS. 7A and 7B, which are cross sectional views along X-X' and Y-Y' directions, respectively. A portion of the gate dielectric 56 is shown as dotted to indicate that this portion is not in the plane of the cross section, but wraps the fin 44 in other planes. Gate dielectric 56 covers the portion where a gate electrode is to be formed, and wraps around fin 44, as shown in FIG. 7B. Gate dielectric 56 preferably comprises materials such as silicon oxide, nitrided silicon oxide, Hf-oxide, and the like, and preferably has an effective oxide thickness of less than about 120 Å.

Figure 8A:
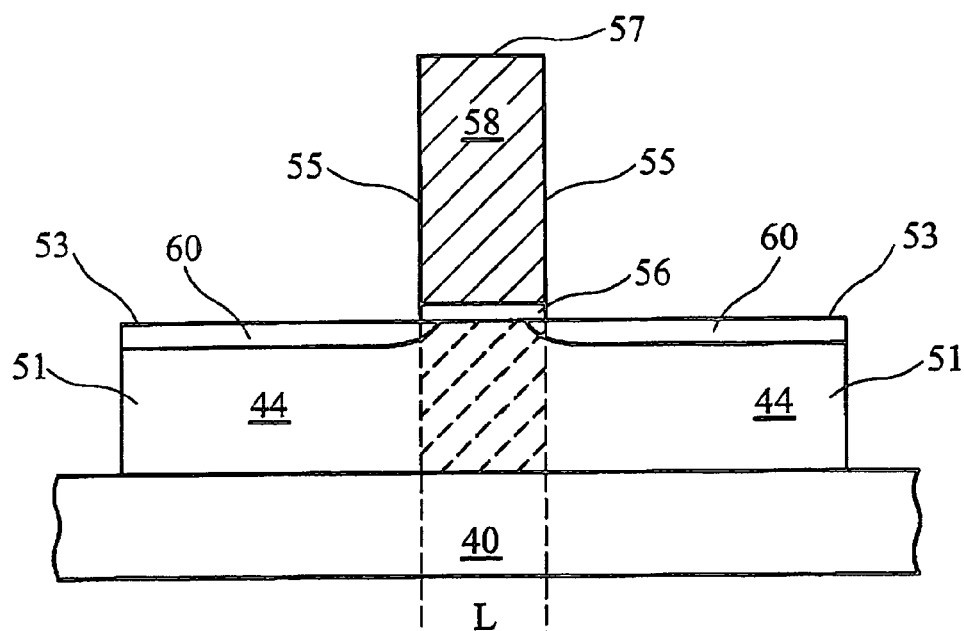
Figure 8B:
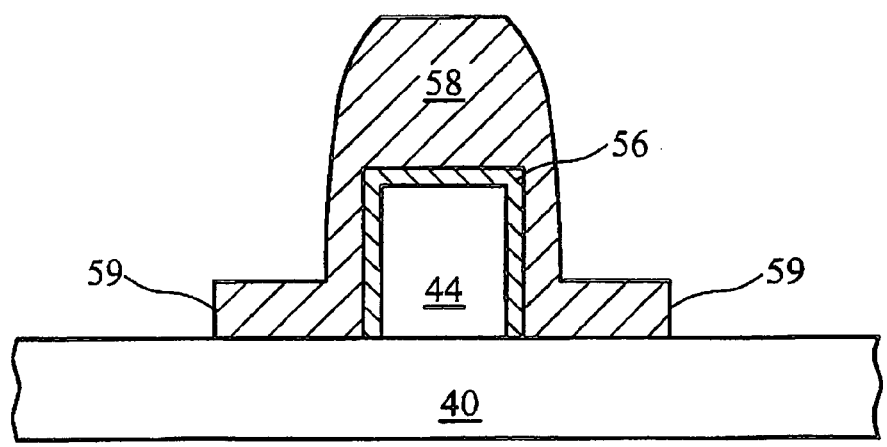

FIGS. 8A and 8B illustrate respective cross sectional views along X-X' and Y-Y' directions of the formation of gate electrode 58. Gate electrode 58 is formed on the gate dielectric layer 56 and comprises commonly used conductive materials known in the art. Preferably, gate electrode 58 has a length L of less than 40 nm, and more preferably less than about 30 nm. As a result, if operated at a low temperature, electrons travel from one-end (source/drain) to the opposite end (drain/source) in a ballistic manner with little scattering in the short channel region. The sidewalls 55 of the gate electrode 58 are preferably substantially perpendicular to the length direction of and cross over fin 44. In other words, the gate electrode has a major axis (length direction) that is substantially perpendicular to the major axis of the fin (and hence is perpendicular to the channel length defined by the source and drain regions). In the preferred embodiment, the exposed surfaces of fin 44, including sidewalls 51 and top surfaces 53, may be lightly doped to form lightly doped source/drain (LDD) regions 60 using gate electrode 58 as a mask. Please note that the sidewalls 51 are actually in planes in front of and behind the plane in which the cross-sectional view is made (refer to FIG. 2 for details). Preferably, n-type impurities are doped. In alternative embodiments, the LDD regions 60 can be formed by diffusion of subsequently formed source/drain regions.

Figure 9:
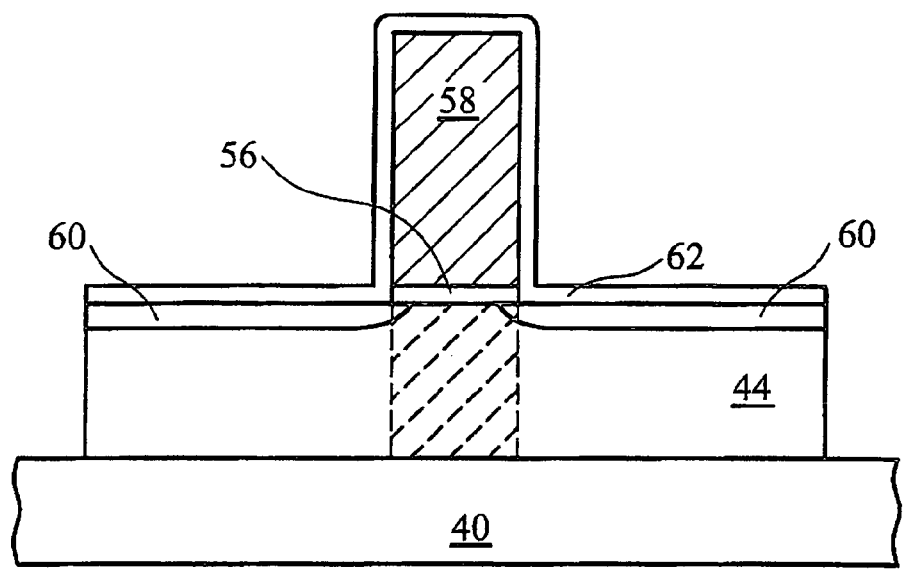

As shown in FIG. 9, a first dielectric layer 62, sometimes referred to as tunneling layer 62, is blanket formed on the sidewalls 51 and top surface 53 of fin 44, as well as sidewalls 55 and top surface 57 of gate electrode 58 (please refer to FIG. 8A). Dielectric layer 62 comprises materials having low defect/trap density (or interface state density) such as silicon oxide, nitride high-k oxide, and the like, and thus charges can tunnel through without being trapped. The thickness of dielectric layer 62 is preferably thin enough for hot carriers to tunnel through efficiently during write operations but thick enough to prevent the leakage of trapped charges during read operations. In the preferred embodiment, dielectric layer 62 has a thickness of less than about 100 Å. The dielectric layer 62 and subsequently formed charge-trapping layer and protection layer can be formed using commonly used methods such as plasma enhanced chemical vapor deposition (PECVD), low-pressure chemical vapor deposition (LPCVD), sub-atmospheric chemical vapor deposition (SACVD), etc.

Figure 10:
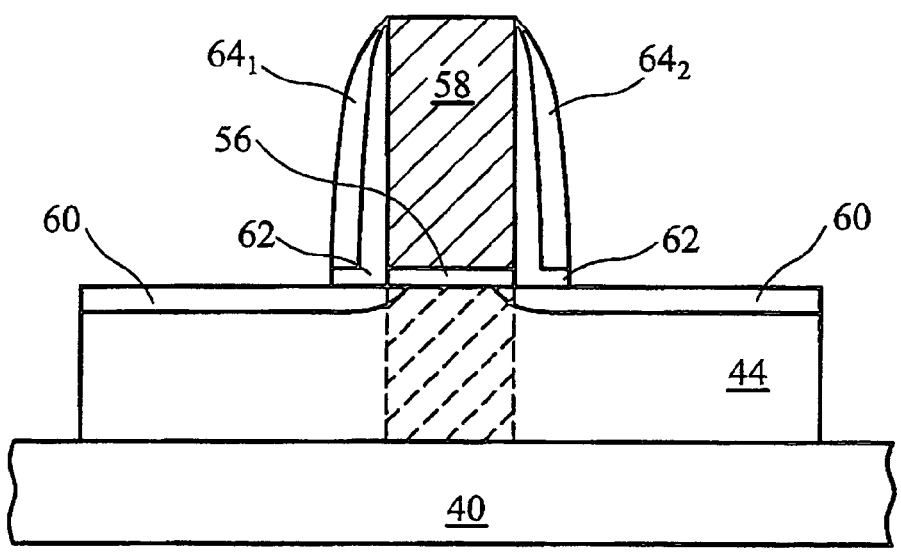

FIG. 10 illustrates the formation of a second dielectric layer 64, which includes $64_1$ and $64_2$, also sometimes called charge-trapping (or storage) layer 64. The charge-trapping layer 64 preferably has an (charge-trapping state) energy level lower than the barrier level of tunneling layer 62, so that charges can be trapped if no bias voltage is applied. In the preferred embodiment, the charge-trapping layer 64 comprises a nitride, such as SiN and the like, high-k oxides, such as $Al_2O_3$ and the like, or oxygenized nitrides, such as SiON, HfSiON, and the like. In other embodiments, the charge-trapping layer 64 comprises discrete charge-trapping nano-crystal/particles, such as silicon nano-crystal, germanium nano-crystal, metal nano-crystal, and the like. The preferred thickness is between about 50 Å and about 800 Å, and more preferably between about 10 Å and about 500 Å.

The previously formed dielectric layers 62 and 64 are then partially etched. The charge-trapping layer 64 is separated into a source side charge-trapping region $64_1$ and a drain-side charge-trapping region $64_2$. In the preferred embodiment, layers 62, $64_1$ and $64_2$ on respective sidewalls of the gate electrode are completely separated. In other embodiments, these layers can be left joined far away from the fin 44, such as on surfaces 59 in FIG. 8B.

Figure 11:
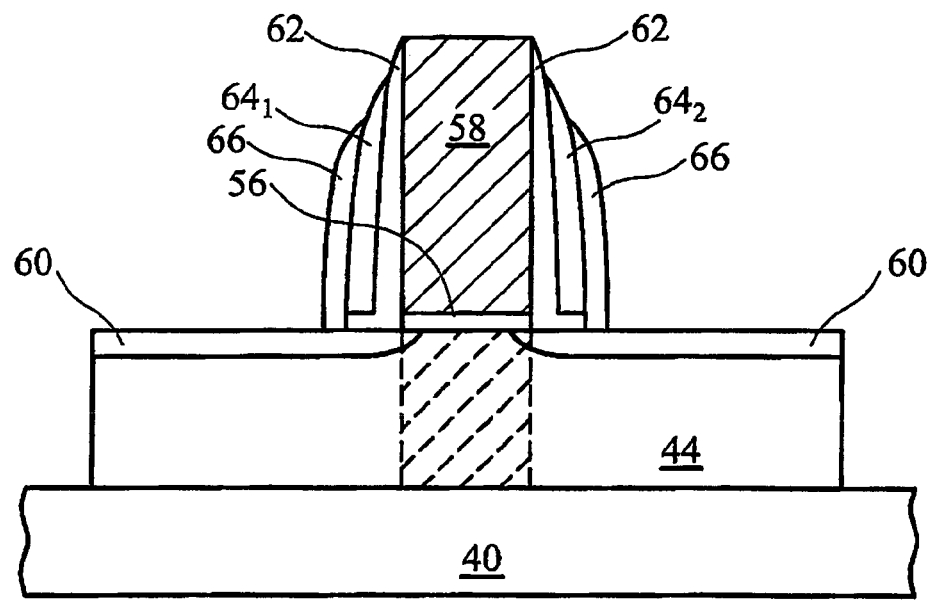

FIG. 11 illustrates the formation of a third dielectric layer 66, also referred to as protection layer 66, covering the charge-trapping regions $64_1$ and $64_2$. Preferably, a dielectric layer is blanket deposited and selectively etched to form protection layer 66. Protection layer 66 prevents stored charges from leaking into the gate and/or the source and drain regions, and thus is preferably formed of materials having low charge-trapping densities. The thickness of the dielectric layer 66 is preferably between about 40 Å and about 500 Å.

Figure 12:
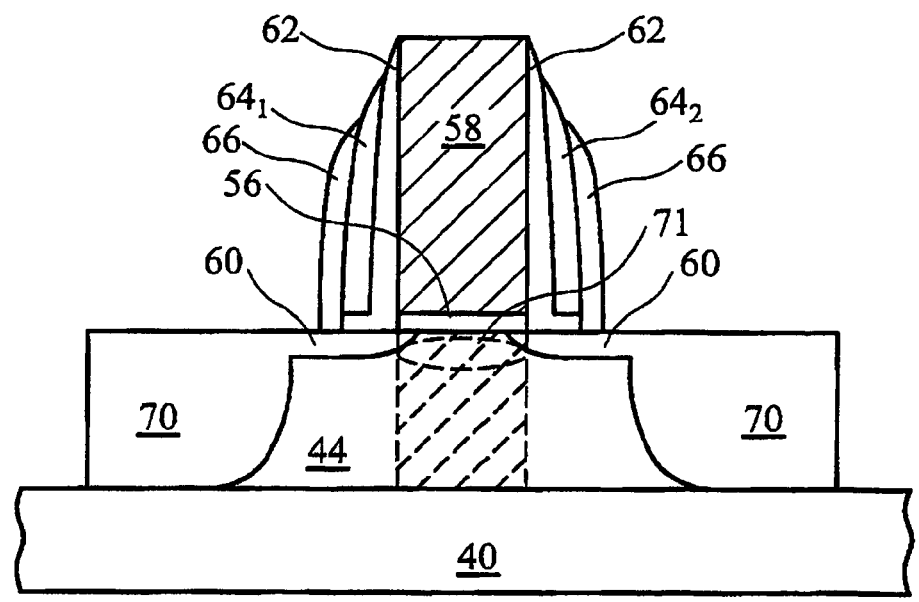

FIG. 12 illustrates the formation of source/drain regions 70, preferably by implanting appropriate impurities. A channel region 71 is thus formed between the source/drain regions 70 (and LDD regions 60). In the preferred embodiment, the source/drain regions 70 are implanted with n type impurities. It is to be noted that the previously discussed embodiments are nMOS memory cells. By reversing the types of impurities in the LDD regions 60, the channel region, and the source/drain regions, pMOS memory cells can be formed.

Charge-trapping regions $64_1$ and $64_2$ store charges, and each of the charge-trapping regions $64_1$ and $64_2$ represents one bit. Thus the memory cell represents two bits, a drain-bit and a source-bit. For simplicity, in subsequent discussions, a source-bit is referred to as the bit stored in charge-trapping region $64_1$, and a drain-bit is referred to as the bit stored in charge-trapping region $64_2$. The operations of the memory cells are related to a circuit operation voltage Vcc. However, the circuit operation voltage Vcc may be different from the core circuit operation voltage. The value of Vcc is preferably related to various factors, such as the critical dimension, the threshold voltage, the ability to generate hot electrons in the LDD regions 60, and the ability to help charges cross the barrier of the tunneling layers 62.

Figure 1A:
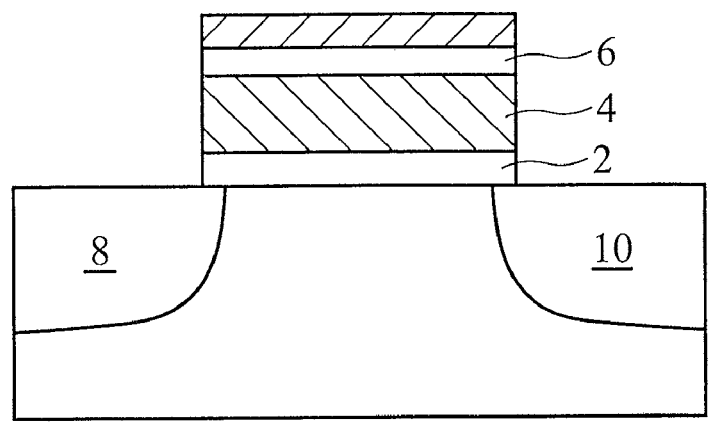
FIG. 1A illustrates a conventional planar flash memory cell.
Figure 1B:
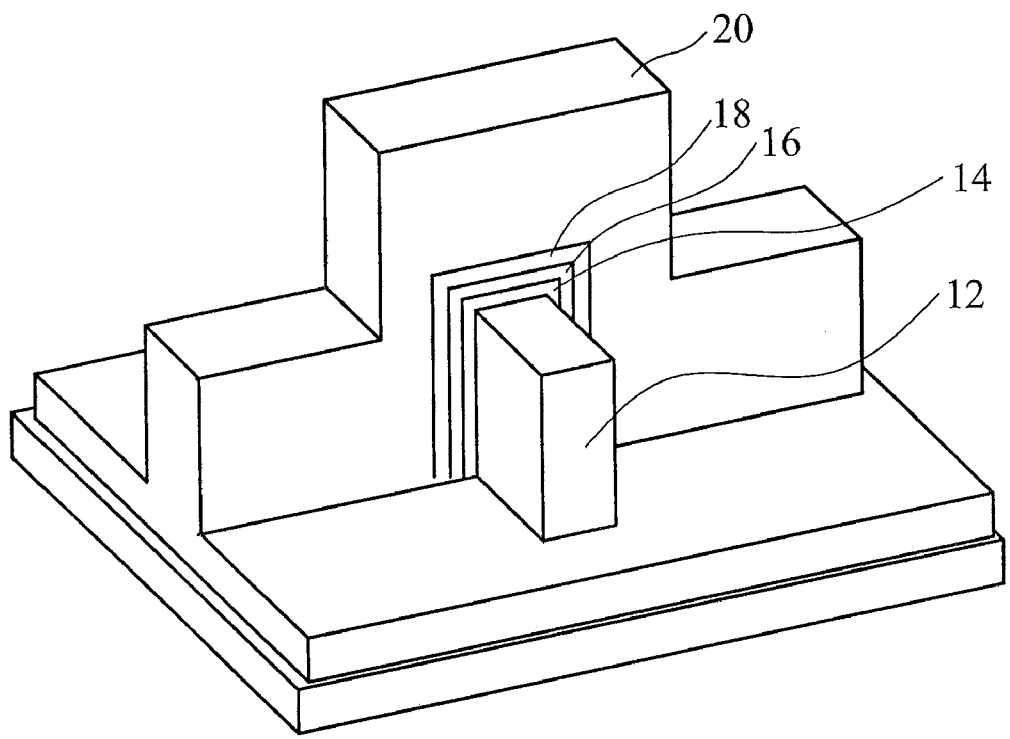
FIG. 1B illustrates a 3-D view of a conventional FinFET flash memory cell.
Figure 13A:
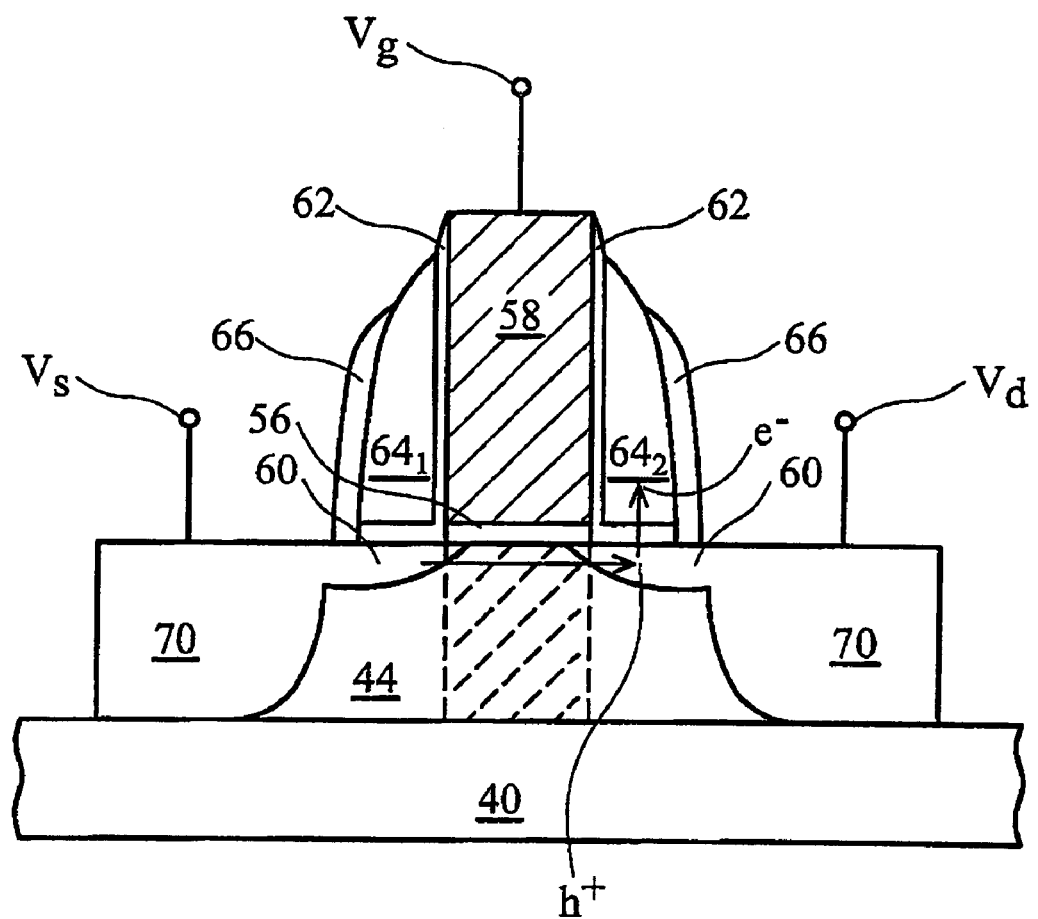
FIGS. 13A and 13B illustrate drain-bit programming and source-bit programming operations, respectively.

FIG. 13A illustrates drain-bit programming of the preferred embodiments of the present invention. Since in the preferred embodiments, charge-trapping regions $64_1$ and $64_2$ are outside a region above the channel region, the channel length can be as short as 40 nm or less. The bias voltages are selected in such as way that the memory cell is in "on" state, and an electrical field high enough to generate hot electrons is biased between the drain and the source. Preferably, a positive gate-to-source voltage helps charges in LDD regions 60 to cross the tunneling layer 62. For example, when a source bias voltage $V_s$ is close to 0V, a drain voltage $V_d$ close to Vcc and a gate voltage close to Vcc/2 are applied, hot carriers are generated on source-side LDD region 60 and transport in the channel in a ballistic manner. Electron-hole pairs are generated inside the drain extension due to impact. Short channel length enhances the local lateral electrical field. Due to the high lateral electrical field established between the drain and the source, a high percentage of the electrons become hot electrons when entering the drain extension region 60. Because of the short channel length and low temperature, impact occurs mostly inside the drain extension region 60, thus electrons are readily injected into the charge-trapping region $64_2$ atop the drain extension 60. While in conventional memory cells as shown in FIG. 1, the channel length is typically greater than about 80 nm, more impacts thus occur in the channel region close to the drain. Even at the same bias, there are less hot electrons generated, more heat generated, and fewer electrons injected into charge-trapping regions.

Figure 13B:
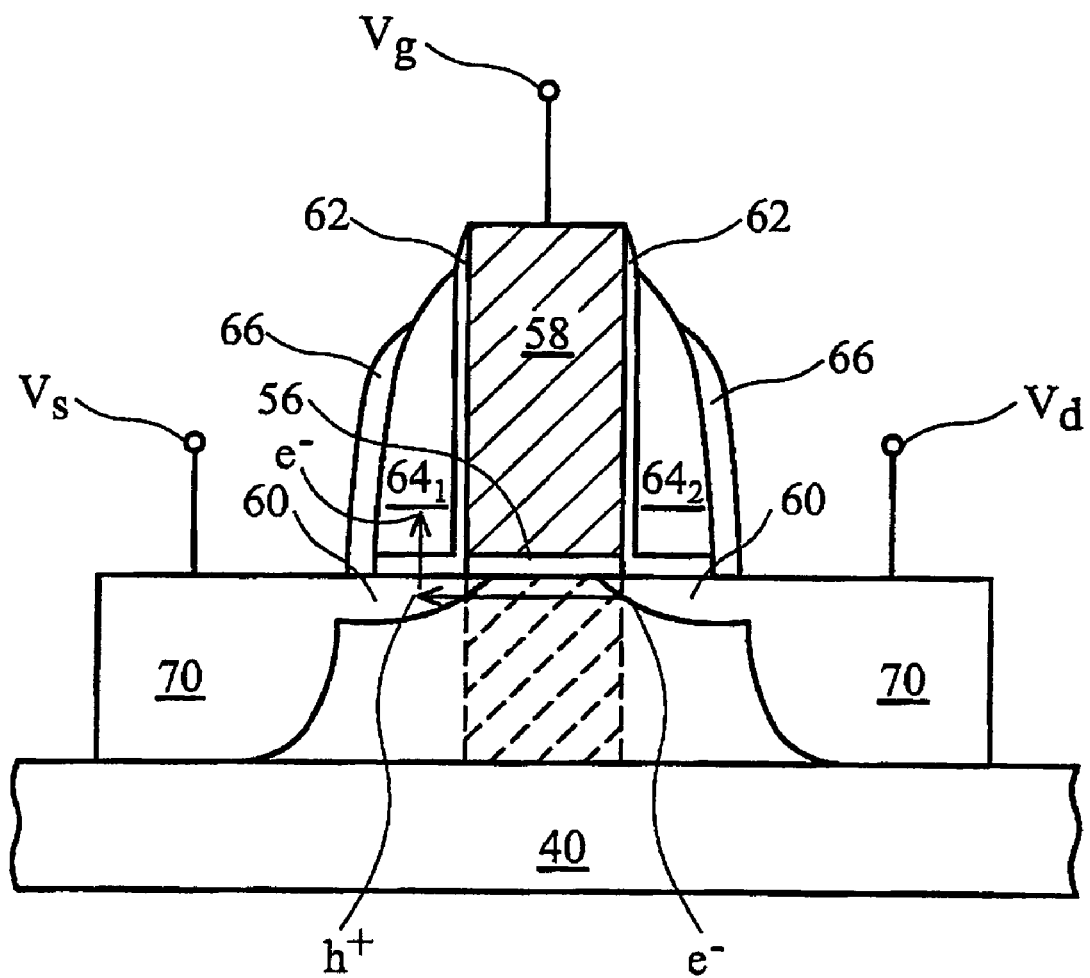

FIG. 13B illustrates a source-bit programming of the preferred embodiments of the present invention. When voltages $V_s$ and $V_d$ applied to the respective source and drain are reversed, charges are trapped in the source-side charge-trapping region $64_1$.

Figure 14:
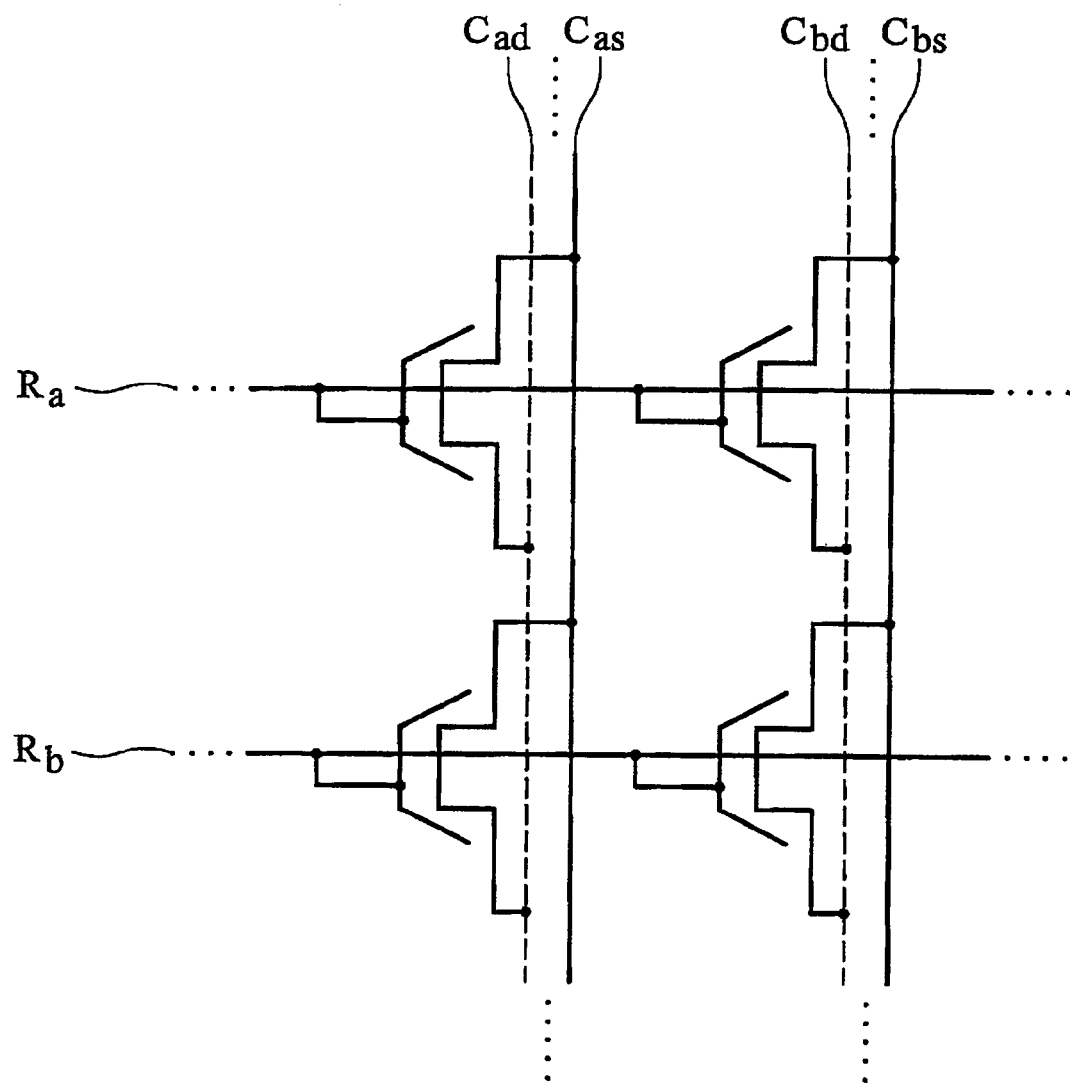
FIG. 14 illustrates an array programming.

FIG. 14 illustrates an array made of the 2-bit memory cells. Memory cells are arranged as rows and columns. Drain regions of the memory cells in the same column are connected to a drain bit-line, as illustrated by doted lines $C_{ad}$ and $C_{bd}$, and source regions of the memory cells are connected to source bit-lines, as illustrated by solid lines $C_{as}$ and $C_{bs}$. The gates of the respective memory cells in one row are connected to one wordline, as illustrated as $R_a$ or $R_b$.

An entire selected column of cells can be programmed at the same time with proper bias at the drain bit-line or the source bit-line, with word-lines of respective rows biased as "1" or "0" representing the data to be stored. For example, if drain-bits of a selected column are to be programmed, the drain bit-line of the selected column is biased at Vcc, while the source bit-line of the respective memory cell is biased at a voltage close to 0V. Similarly, if source-bits of a selected column are to be programmed, the source bit-line of the selected column is biased at Vcc, while the drain bit-line of the respective memory cell is biased at a voltage close to 0V.

With a selected bit-line (column) and a selected word-line (gate), single-bit programming of one memory cell is possible. All unselected word-lines and bit-lines are grounded. The applicable bias voltages have been described in previously discussed drain-bit programming and source-bit programming, and thus are not repeated.

Figure 15A:
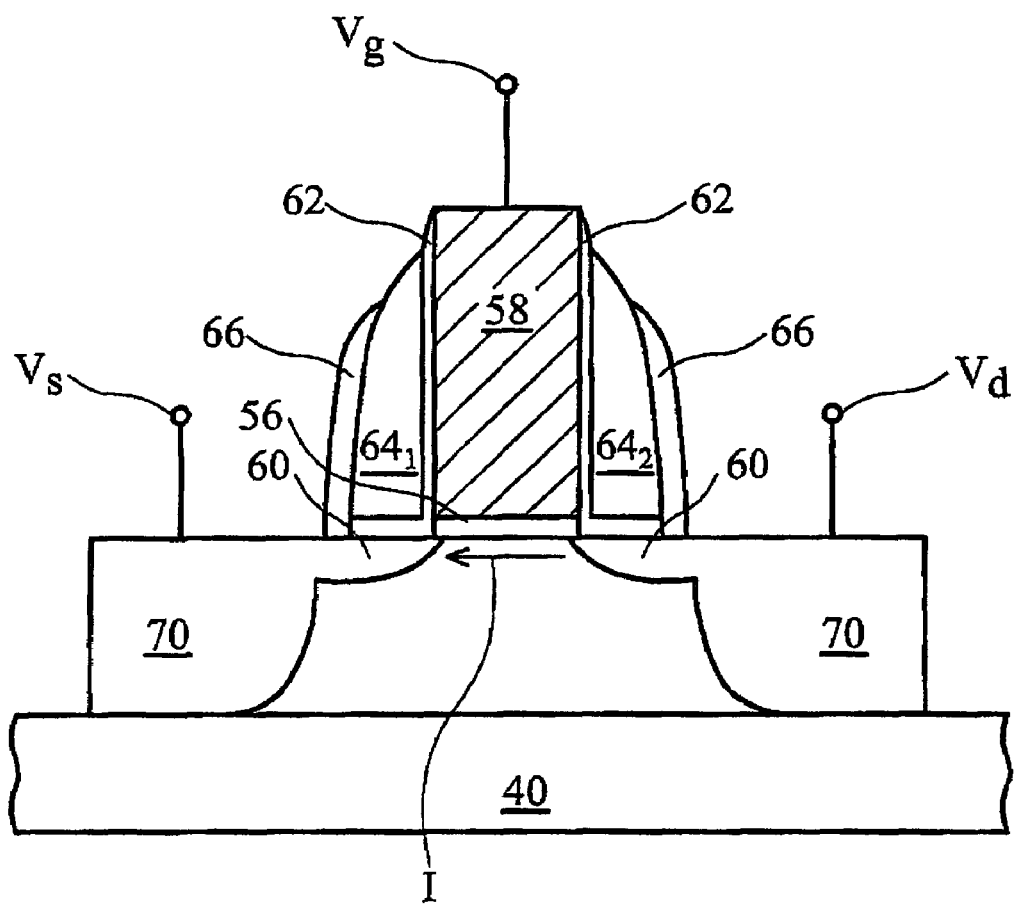
FIG. 15A illustrates how voltages are applied for read and erase operations.
Figure 15B:
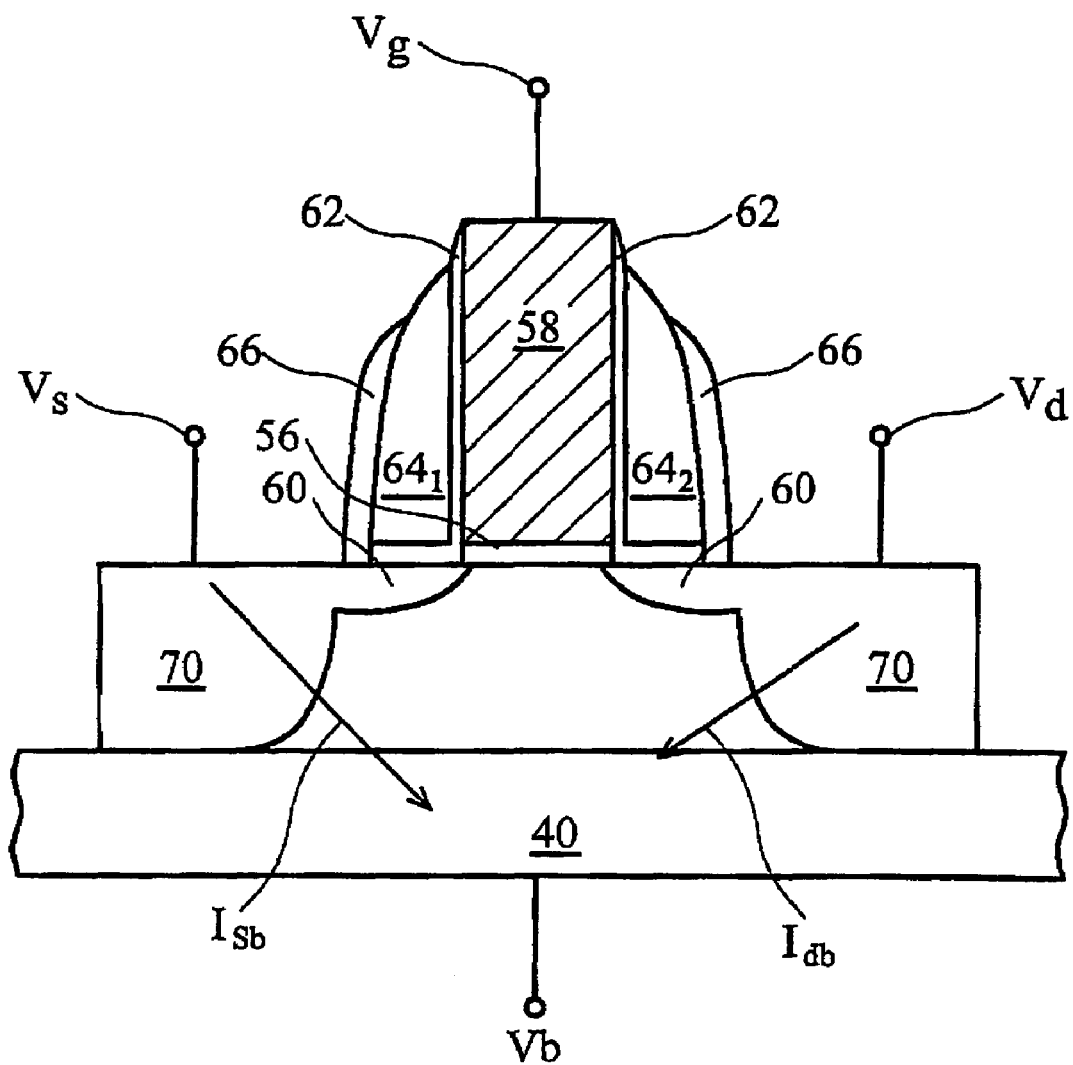
FIG. 15B illustrates a parallel read operation using gate-induced drain leakage current.

Read operations can be performed by using channel current for 1-bit read or gate-induced drain leakage (GIDL) current for simultaneous 2-bit read, as illustrated in FIGS. 15A and 15B. FIG. 15A illustrates a 1-bit read using channel current. Preferably, gate 58 is biased at a low voltage Vg greater than the threshold voltage, such as a voltage between about 0.2 Vcc and 0.8 Vcc. Between the drain and the source, a voltage Vd-Vs is applied so that a channel current I is generated.

The drain extension resistance is modulated by the amount of charges stored in charge-trapping region $64_2$. Therefore, the magnitude of drain current I can be used for determining if the charge trapping region $64_2$ on the drain side is charged or not. The preferred embodiments of the present invention are preferably used for storage on the drain side when they are used for 1-bit storage. However, charges can also be stored on the source side, and source-bit can also be read by reversing the voltages Vd and Vs applied to the respective drain and source.

It is difficult to differentiate whether a "1" bit is a drain-bit or a source-bit using channel current. However, GIDL current on the drain or source side is also strongly modulated by the charges stored in the respective charge-trapping region atop, and can be used for read operations. Referring to FIG. 15A, 2 bits can be sequentially determined by measuring GIDL currents on both sides sequentially. Drain-side GIDL current can be measured by applying a voltage between the drain and the source, with no bias voltage $V_g$ on the gate. An exemplary setting for a drain-bit reading is: $V_g=0V, V_s=0V,$ and $V_d=Vcc/2$. If a high GIDL current is detected, the drain-side charge-trapping region $64_2$ is charged. Conversely, if a low GIDL current is detected, the drain-side charge-trapping region $64_2$ is not charged. Similarly, the GIDL current on the source-side can be measured by swapping the bias voltages at the drain and the source.

FIG. 15B shows a simultaneous 2-bit read by measuring source and drain GIDL currents simultaneously. The body of the memory cell is grounded or negatively biased at a voltage $V_b$. Furthermore, if the memory cells are fabricated on bulk wafers, bodies of all memory cells are preferably connected and grounded or negatively biased. In an exemplary setting, both $V_d$ and $V_s$ are Vcc/2, and $V_g$ is 0V. Both GIDL currents $I_{db}$ and $I_{sb}$ can be measured at the same time, and the magnitudes can be used for determining whether the respective charge-trapping region is charged or not.

Stored bits can be erased by tunneling trapped charges through tunneling layer 62 from charge-trapping regions $64_1$ or $64_2$ to the respective source/drain regions (please refer to FIG. 15A). Erase operations can be performed by applying drain and/or source bias voltages separately or simultaneously. Applicable bias voltages are preferably in such a range that electrical fields will be established and will help trapped charges cross the tunneling layer 62. In other words, the energy provided to the trapped charges is preferably greater than the barrier level of the tunneling layer 62. An nMOS FinFET memory cell will store negative charges (electrons) in the charge-trapping regions. During the erase operation, electrons can be removed (erased) by applying a (positive) high voltage, such as +Vcc on the source/drain region, and a 0V or negative bias voltage, such as −0.5V, to the gate. If a single bit of a single memory cell in an array is to be erased without affecting other memory cells, a bias Vcc can be applied on the selected bit, and all unselected bits are grounded or negatively biased. Similarly, a pMOS FinFET SONOS-type cell will store positive charges (holes) in the charge-trapping regions, thus the erase operation can be performed by reversing the polarities of bias. For example, applying (−Vcc/2) to a selected bit-line, Vcc on a selected word-line, and applying −Vcc/2 to unselected bit-lines and word-lines.

Multiple-erase operations can be performed by applying appropriate bias voltages, so that selected memory cells will have strong enough electrical fields for trapped charges to be discharged, while unselected memory cells will have low electrical fields (or electrical fields in opposite directions). Multiple-erase operations can also be explained using FIG. 14. For example, cells in a selected column $C_b$ can be erased by applying a positive bias voltage Vcc to respective bit-lines and a 0V to −Vcc/2 on all word-lines. Bit-lines of unselected columns are preferably biased at 0V. Multiple columns of memory cells can be erased simultaneously by biasing bit-lines of all selected columns of memory cells at +Vcc.

Similarly, cells in a selected row can be erased by biasing the respective word-line at a negative voltage, such as −Vcc/2, with all unselected word-lines biased at a positive voltage, such as +Vcc/2, and all bit-lines biased at +Vcc. Multiple rows can be simultaneously erased if respective work-lines are biased at Vcc/2. Erasing a selected memory cell is performed by biasing −Vcc/2 at the respective word-line of the cell and +Vcc/2 at all other word-lines. Meanwhile, respective bit-lines of the selected memory cell are biased at +Vcc, and all other bit-lines are grounded.

From the previously discussed operations, it is appreciated that gate dielectric 58 atop the channel suffers much less degradation than gate dielectrics in conventional flash memory cells. The reason is that gate dielectric 58 in the preferred embodiment is away from the region for hot carrier generation and injection (during programming), as well as tunneling (during erase). As a result, the preferred embodiments of the present invention have improved gate dielectric reliability and better program/erase cycling performance.

The preferred embodiments of the present invention have several advantageous features. Firstly, the preferred embodiments of the present invention are capable of being used as both 1-bit and 2-bits memory cells, and programming, read and erase operations can be easily performed by adjusting bias voltages. Secondly, a new mechanism of hot carrier generation and injection utilizes ballistic transport of carriers through very short channel regions. The new mechanism efficiently charges the charge-trapping regions. Thirdly, the preferred embodiments of the present invention have charge-trapping regions outside a region above the channel region, therefore are well adapted for scaling, particularly for 45 nm and beyond.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A memory cell capable of storing 2 bits, the memory cell comprising:
   a semiconductor fin on a top surface of a substrate, the semiconductor fin having two sidewalls and a top surface, wherein the semiconductor fin comprises a middle channel section, two source/drain regions, and two extension sections, and wherein each of the extension sections is between the middle channel section and the respective source/drain region;
   a gate insulation film on a top surface and sidewalls of the middle channel section of the semiconductor fin;
   a gate electrode on the gate insulation film, the gate electrode having two sidewalls on planes substantially perpendicular to a major axis of the semiconductor fin;
   two tunneling layers, each of the tunneling layers being along one of the sidewalls of the gate electrode and on at least a portion of the semiconductor fin close to the gate electrode; and
   two charge-trapping regions substantially along opposite sides of the gate electrode, each of the charge-trapping regions being separated from the gate electrode and the semiconductor fin by the respective tunneling layer.

2. The memory cell of claim 1 wherein the substrate is a buried oxide, and wherein the semiconductor fin comprises a material selected from the group consisting essentially of silicon, strained silicon, silicon on silicon-germanium, strained silicon on silicon-germanium, and combinations thereof.

3. The memory cell of claim 1 wherein the substrate comprises two shallow trench isolations (STIs) spaced apart and having the semiconductor fin therebetween, wherein each of the STIs is substantially aligned with a respective side edge of the semiconductor fin, and wherein the STIs have top surfaces substantially lower than a top surface of the semiconductor fin.

4. The memory cell of claim 3 wherein the semiconductor fin comprises a silicon portion and an epitaxially grown portion on the silicon portion, wherein the epitaxially grown portion comprises a material selected from the group consisting essentially of silicon, germanium, and combinations thereof.

5. The memory cell of claim 1 wherein the gate insulation film has an effective thickness of less than about 120 Å.

6. The memory cell of claim 1 wherein the gate insulation film comprises a material selected from the group consisting essentially of silicon oxide, nitrided silicon oxide, Hf-oxide, nitrided Hf-oxide, and combinations thereof.

7. The memory cell of claim 1 wherein the middle channel section of the semiconductor fin has a length of less than about 40 nm.

8. The memory cell of claim 1 wherein the two charge-trapping regions are physically separated.

9. The memory cell of claim 1 wherein the tunneling layers have a thickness of less than about 100 Å.

10. The memory cell of claim 1 wherein the tunneling layers comprise a material selected from the group consisting essentially of silicon oxide, nitrided oxide, and combinations thereof.

11. The memory cell of claim 1 wherein the charge-trapping regions have a thickness of between about 10 Å and about 500 Å.

12. The memory cell of claim 1 wherein the charge-trapping regions comprise a material selected from the group consisting essentially of silicon nano-crystal, germanium nano-crystal, metal nano-crystal, and combinations thereof.

13. The memory cell of claim 1 wherein the charge-trapping regions comprise a material selected from the group consisting essentially of a nitride, an oxide an oxygenized nitride, and combinations thereof.

14. The memory cell of claim 1 further comprising a protection layer over each of the charge-trapping regions wherein the protection layer has a thickness of between about 40 Å and about 500 Å.

* * * * *